(12) United States Patent
Beier

(10) Patent No.: US 6,734,710 B2
(45) Date of Patent: May 11, 2004

(54) CIRCUIT ARRANGEMENT FOR PULSE GENERATION

(75) Inventor: Ralf Beier, Hamburg (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/352,743

(22) Filed: Jan. 28, 2003

(65) Prior Publication Data
US 2003/0155957 A1 Aug. 21, 2003

(30) Foreign Application Priority Data

Feb. 2, 2002 (DE) .......................................... 102 04 294

(51) Int. Cl.$^7$ ................................................. H03K 3/00
(52) U.S. Cl. ....................... 327/291; 327/538; 327/77; 327/93; 327/97; 323/314; 323/316
(58) Field of Search ................................. 327/291, 293, 327/538, 72, 74, 76, 77, 91, 93, 94, 95, 96, 97; 323/312–316

(56) References Cited

U.S. PATENT DOCUMENTS

| 4,570,089 A | * | 2/1986 | Nagano ....................... 327/115 |
| 5,818,295 A | * | 10/1998 | Chimura et al. ............ 327/561 |
| 6,121,805 A | * | 9/2000 | Thamsirianunt et al. .... 327/175 |

* cited by examiner

Primary Examiner—Timothy P. Callahan
Assistant Examiner—An T. Luu
(74) Attorney, Agent, or Firm—Kevin Simons

(57) ABSTRACT

The invention relates to a circuit arrangement for pulse generation, having a capacitor, to which a charging current and a discharging current may be supplied in succession. To generate the charging current and the discharging current, there are provided a current source, a first current mirror circuit and a second current mirror circuit complementary to the first current mirror circuit. The current mirror circuits each comprise a plurality of output transistors, which each constitute an output stage for the charging and discharging current, which is connected to a regulator, and for a circuit for controlling the tail current of a differential amplifier forming the regulator. A current output of the differential amplifier is connected to the output of the second current mirror circuit.

4 Claims, 2 Drawing Sheets

CIRCUIT ARRANGEMENT FOR PULSE GENERATION

Figure 1:
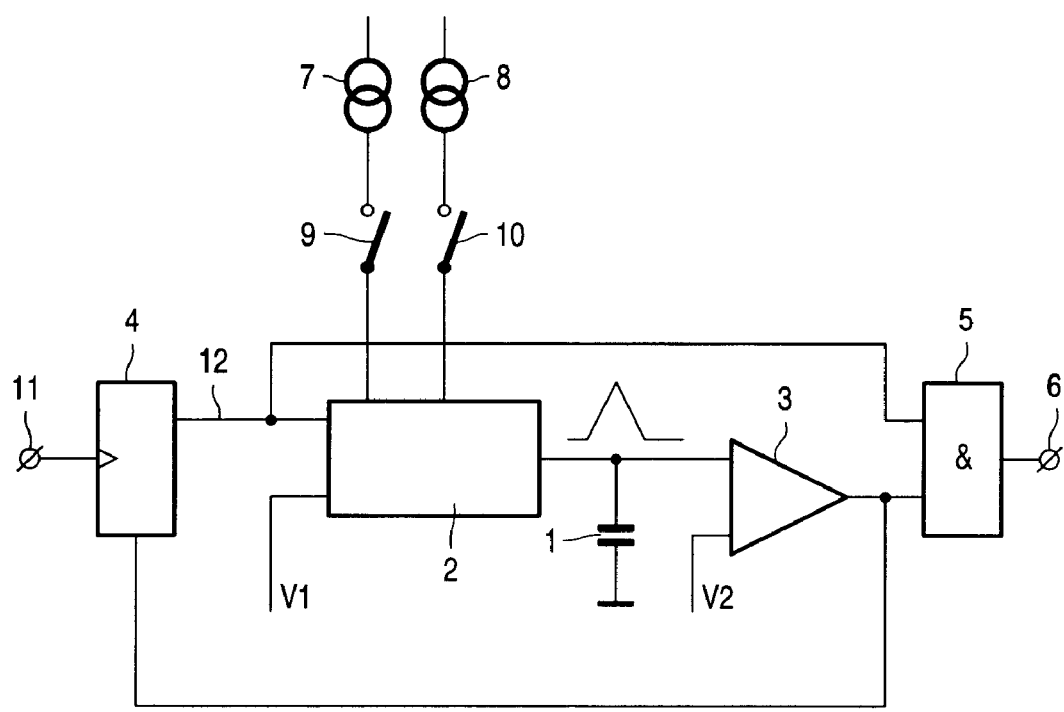

The invention relates to a circuit arrangement for pulse generation.

Circuit arrangements having a pulse duration dependent on the charging current of a capacitor have, inter alia, the advantage that the pulse duration may be set within wide limits. To achieve stability of the pulse duration set in each case, it is important, in addition to the stability of the voltage rise at the capacitor, also to keep constant the offset or the voltage at the capacitor between the pulses. This lower threshold is especially necessary if a semiconductor layer serves as capacitor plate in integrated circuits and the capacitor exhibits constant capacitance only from a minimum voltage.

It is an object of the invention to provide a circuit arrangement in which this offset is kept constant.

This object is achieved according to the invention in that a charging current and a discharging current may be supplied in succession to a capacitor, with a threshold value switch connected to the capacitor and a bistable circuit connected to the threshold value switch, the output of which bistable circuit outputs a switching signal during supply of the charging current, a current source, a first current mirror circuit and a second current mirror circuit complementary to the first current mirror circuit are provided to generate the charging current and the discharging current, the first current mirror circuit comprises an input transistor and three output transistors connected with the gate electrodes thereof, wherein the first of the output transistors comprises a larger area than the second and third output transistors, the drain electrodes of the first output transistor and an input transistor of the second current mirror circuit are connected together, the drain electrodes of the second output transistor of the first current mirror circuit and an output transistor of the second current mirror circuit are connected together, to the capacitor and to an input of a regulator in the form of a differential amplifier, the third output transistor of the first current mirror circuit and a further output transistor of the second current mirror circuit are connected together to form an output stage and are connected to a circuit for controlling the tail current of the differential amplifier and a current output of the differential amplifier is connected to the drain electrode of the output transistor of the second current mirror circuit.

With the circuit arrangement according to the invention, pulses of adjustable width may be generated, wherein the width is adjustable via corresponding control of the current source. The circuit arrangement according to the invention further exhibits the advantage that it may be easily integrated with conventional technologies. Accordingly, the circuit is preferably produced with MOS field effect transistors. However, implementation with bipolar transistors is not ruled out in principle.

In order also to keep an offset of the differential amplifier small, provision is made according to a further development for the circuit for generating the tail current of the differential amplifier to consist of a third and a fourth current mirror circuit, wherein the current supplied to the circuit is doubled.

In still a further development, particularly advantageous introduction of the control signal into the output stage and advantageous switching of the charging current are achieved in that the differential amplifier takes the form of two source-coupled transistors, wherein the switching signal may be supplied by the bistable circuit to the drain electrode of a transistor of the differential amplifier and wherein a fifth current mirror circuit is provided in the output circuit of this transistor, the output of which fifth current mirror circuit is connected with the drain electrode of the output transistor of the second current mirror circuit.

In the case of the circuit arrangement according to the invention, the current mirror circuits are assisted in functioning more accurately by an advantageous development which consists in the fact that the output transistors of the first and second current mirror circuits are each supplemented by a further transistor in cascode connection.

Figure 2:
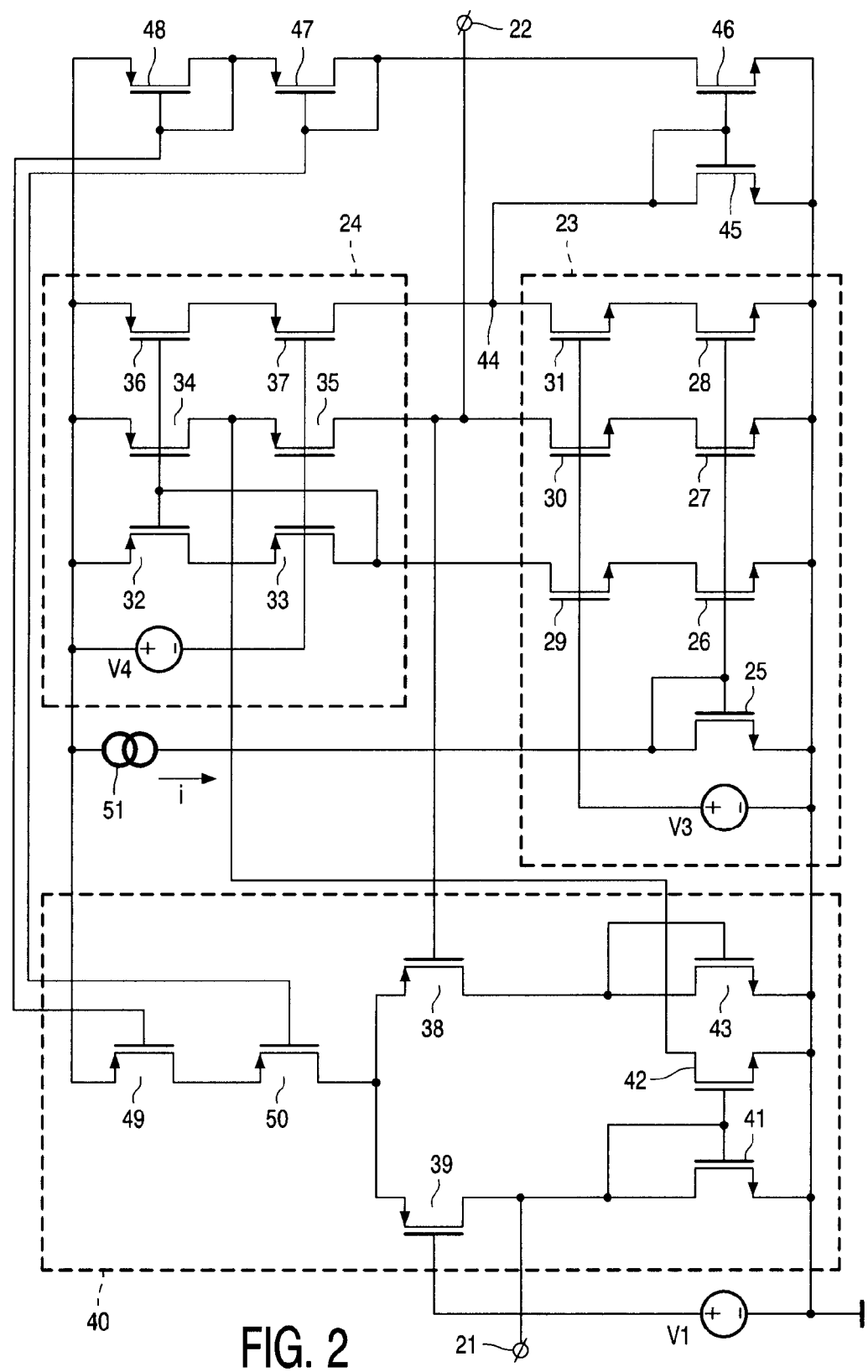

The invention will be further described with reference to embodiments shown in the drawings to which, however, the invention is not restricted. In the Figures:

FIG. 1 is a block diagram of the circuit arrangement according to the invention and FIG. 2 is a detailed representation of the circuit for generating the charging current and the discharging current for the capacitor, hereinafter also known as charging and discharging circuit.

The circuit arrangement shown in FIG. 1 consists substantially of a capacitor 1, a charging and discharging circuit 2, a differential amplifier 3 serving as threshold value switch, a bistable circuit 4 and an AND gate 5, at the output 6 of which the pulse to be generated may be taken off. The charging and discharging circuit 2 is shown only schematically in FIG. 1, with in each case one current source 7, 8 for the charging and discharging process, which may be activated by means of switches 9, 10. A reference voltage V1 is supplied to the charging and discharging circuit 2, while the threshold value switch 3 receives a reference voltage V2.

If a trigger signal is supplied to the circuit arrangement via an input 11, the output 12 of the bistable circuit assumes a level which starts the charging process in the charging and discharging circuit 2. If the voltage at the capacitor has reached an upper threshold, the threshold value switch 3 responds and resets the bistable circuit 4. The signal at the output 12 then jumps back to its original level, whereby the discharging process is initiated in the charging and discharging circuit 2. An AND operation of the output signals of the threshold value switch 3 and the bistable circuit 4 then results in the desired pulse.

The rise time of the leading edge of the triangular voltage at the capacitor 1 is therefore decisive for the duration of the pulse. As already mentioned, it is important to keep the offset of the capacitor voltage 1 constant. This is explained in more detail with reference to the exemplary embodiment according to FIG. 2.

FIG. 2 illustrates the charging and discharging circuit 2 in more detailed manner. It is connected via an input 21 to the output 12 of the bistable circuit 4 (FIG. 1) and via an output 22 to the capacitor 1 or an input of the threshold value switch 3. To generate the charging and discharging current there are provided a first current mirror circuit 23 and a second current mirror circuit 24. The first current mirror circuit 23 consists of an input transistor 25 and output transistors 26, 27, 28 connected therewith via the gate electrodes. Further output transistors 29, 30, 31 are connected thereto in each case in cascode, to the gate electrodes of which there is applied a constant voltage V3.

In the second current mirror circuit 24, two input transistors 32, 33 are connected in cascode, as are the output transistors 34, 35, 36, 37. A constant voltage V4 is applied to the gate electrodes of the transistors 33, 35, 37. In a practical embodiment of the circuit, V3 and V4 each amount to 2V.

The drain electrodes of the transistors 35 and 30 form the output 22 and are additionally connected to the gate electrode of a transistor 38, which together with the transistor 39 forms a differential amplifier, which serves as a regulator for the offset voltage. In addition, the differential amplifier 40 serves in switching the charging process on and off. To this end, the drain electrode of the transistor 39 is connected with the input 21 and with the input transistor of a further current mirror circuit.

The output transistor 42 of the further current mirror circuit is connected to the connecting point between the drain electrode of the transistor 34 and the source electrode of the transistor 35. In addition, for reasons of symmetry the differential amplifier includes a further transistor 43 in the drain circuit of the transistor 38.

The tail current of the differential amplifier 40 is controlled as a function of the output signal. To this end, the transistors 28, 31, 36 and 37 form a measuring circuit, the output 44 of which is passed over a third current mirror circuit 45, 46 and a fourth current mirror circuit 47 to 50. The area ratio of the transistor 46 to the transistor 45 is 2:1, such that the tail current of the differential amplifier 40 is twice as big as the differential current from the transistors 34 and 27. In this way, a small differential amplifier offset is achieved.

To enable the charging process, the input 21 is set to ground potential. The current mirror circuit 41, 42 does not then supply any current to the output stage, such that the charging process proceeds as follows without being influenced by the regulator: the current generated by means of an adjustable current source 51 is mirrored by means of the current mirror circuit 23 in such a way that an equally large current flows through the transistors 26, 29, 32, 33, while only n times the current flows through the transistors 27, 30, since these exhibit a correspondingly smaller area and thus n is less than 1. However, the "whole" current is mirrored in the second current mirror circuit 24, thereby resulting in (1−n) times the applied current as output current.

If the voltage at the capacitor reaches the upper threshold, the differential amplifier 40 is enabled into a high-resistance state by means of the threshold value switch 3 and the bistable circuit 4 (FIG. 1) by switching of the input 21. However, at this time the voltage at the capacitor or at the output 22 is higher, for example 2.5V, than the reference voltage V1 of for example 1V. The transistor 38 is blocked thereby, while the transistor 39 receives the whole tail current and passes this over the current mirror circuit 41, 42 to the circuit point 52 and thus through the transistor 34.

The current through the transistor 35 is thereby reduced by double the difference from the currents of the transistors 28 and 36, such that the capacitor is discharged. If the voltage at the output 22 approaches the reference voltage V1, the differential amplifier 40 enters its operating range, whereby the current through the transistor 42 becomes lower, the output transistors 34, 35 of the second current mirror circuit 24 again supply larger current and thus reduce the discharging current until a stable state is reached, at which the voltage remains constant at the output 22.

What is claimed is:

1. A circuit arrangement for pulse generation, characterized in that a charging current and a discharging current may be supplied in succession to a capacitor (1), with a threshold value switch (3) connected to the capacitor (1) and a bistable circuit (4) connected to the threshold value switch (3), the output (12) of which bistable circuit (4) outputs a switching signal during supply of the charging current, a current source (51), a first current mirror circuit (23) and a second current mirror circuit (24) complementary to the first current mirror circuit (23) are provided to generate the charging current and the discharging current, the first current mirror circuit (23) comprises an input transistor (25) and three output transistors (26, 27, 28) connected with the gate electrodes thereof, wherein the first of the output transistors (26) comprises a larger area than the second and third output transistors (27, 28), the drain electrodes of the first output transistor (26) and an input transistor (32) of the second current mirror circuit are connected together, the drain electrodes of the second output transistor (27) of the first current mirror circuit (23) and an output transistor (34) of the second current mirror circuit (24) are connected together, to the capacitor and to an input of a regulator in the form of a differential amplifier (40), the third output transistor (28) of the first current mirror circuit (23) and a further output transistor (36) of the second current mirror circuit (24) are connected together to form an output stage and are connected to a circuit (45 to 50) for controlling the tail current of the differential amplifier (40) and a current output (42) of the differential amplifier (40) is connected to the drain electrode of the output transistor (34) of the second current mirror circuit (24).

2. A circuit arrangement as claimed in claim 1, characterized in that the circuit for generating the tail current of the differential amplifier consists of a third (45, 46) and a fourth (47, 48, 49, 50) current mirror circuit, wherein the current supplied to the circuit is doubled.

3. A circuit arrangement as claimed in claim 1, characterized in that the differential amplifier (40) takes the form of two source-coupled transistors (38, 39), wherein the switching signal may be supplied by the bistable circuit (4) to the drain electrode of a transistor (39) of the differential amplifier (40) and wherein a third current mirror circuit (41, 42) is provided in the output circuit of this transistor (39), the output of which third current mirror circuit (41, 42) is connected to the drain electrode of the output transistor (34) of the second current mirror circuit (24).

4. A circuit arrangement as claimed in claim 1, characterized in that the output transistors (26, 27, 28, 34, 36) of the first and second current mirror circuits are each supplemented by a further transistor (29, 30, 31, 35, 37) in cascode connection.

* * * * *